United States Patent [19]

Cho

[11] Patent Number: 5,453,399
[45] Date of Patent: Sep. 26, 1995

[54] METHOD OF MAKING SEMICONDUCTOR-ON-INSULATOR STRUCTURE

[75] Inventor: Chih-Chen Cho, Richardson, Tex.

[73] Assignee: Texas Instruments Incorporated, Dallas, Tex.

[21] Appl. No.: 132,597

[22] Filed: Oct. 6, 1993

[51] Int. Cl.$^6$ .................................................. H01L 21/20
[52] U.S. Cl. ........................... 437/131; 437/62; 437/105; 437/107; 437/126; 437/132
[58] Field of Search ................................... 437/132, 131, 437/126, 107, 105, 62

OTHER PUBLICATIONS

Asano et al. in "Heteroepitaxial Si,Ge, and GaAs on insulator structures on Si substrates by use of fluoride insulators" Materials Research Society Symposium Proceedings vol. 91, (1987), pp. 337 348.

*Primary Examiner*—R. Bruce Breneman
*Assistant Examiner*—Ramamohan Rao
*Attorney, Agent, or Firm*—Michael K. Skrehot; James C. Kesterson; Richard L. Donaldson

[57] ABSTRACT

In one form of the invention, a method is disclosed for fabricating a semiconductor-on-insulator structure comprising the steps of: forming an insulator layer 22; forming a layer 24 comprising boron (B) on the insulator layer 22; and forming a semiconductor layer 26 on the layer 24 comprising B.

13 Claims, 7 Drawing Sheets

METHOD OF MAKING SEMICONDUCTOR-ON-INSULATOR STRUCTURE

FIELD OF THE INVENTION

This invention generally relates to semiconductor-on-insulator structures, and more particularly to semiconductors on fluoride insulators.

BACKGROUND OF THE INVENTION

Heteroepitaxial semiconductor/group-II fluoride/Si structures are potentially useful in a number of semiconductor-on-insulator technologies. As one of the most promising candidates in this area, the $CaF_2$/Si couple has attracted considerable attention (see T. Asano and H. Ishiwara, "Epitaxial Growth of Ge Films onto $CaF_2$/Si Structures", Jpn. J. Appl. Phys., 21, p. L630, 1982, and R. W. Fathauer, et al., "Heteroepitaxy of semiconductor-on-insulator structures: Si and Ge on $CaF_2$/Si(111)", J. Appl. Phys. 60(11), p.3886, 1986). From a materials preparation point of view, $CaF_2$ is a relevant choice among the fluorides for deposition on silicon because it fits several important criteria for a good epitaxial system, i.e. small lattice mismatch and similar cubic structure. Previous studies have shown that the chemical and structural properties of the $CaF_2$/Si interface vary under different deposition conditions and that these variations can significantly change the electrical characteristics of a system incorporating this interface. Co-assigned patent application Ser. No. 07/704,535 describes a method that allows the growth of films in which the orientation of the $CaF_2$ film is essentially identical to that of the silicon substrate, a characteristic which is important for good interface properties. Additionally, coassigned U.S. Pat. No. 5,229,333 discloses a low-temperature growth technique for producing improved $CaF_2$/Si interfaces.

A primary concern in obtaining good crystal growth by molecular-beam-epitaxy (MBE) or other related vapor-phase techniques is the growth mode of the film. Both lattice strain and surface free energy help determine whether a film undergoes layer-by-layer growth (Frank-Van der Merwe), islanding (Volmer-Weber), or layer-by-layer growth followed by islanding (Stranski-Krastanov). Deliberate introduction of a surfactant that alters the surface free energy can change the growth mode of a film. Surfactants such as Sb, Ga, As, and Te have been widely studied for improving the epitaxial growth of Ge on Si (See, for example, M. Copel, et al. "Surfactants in Epitaxial Growth", Phys. Rev. Lett. 63(6), p.632, August 1989, or R. Cao, et al. "Microscopic study of the surfactant-assisted Si, Ge epitaxial growth", Appl. Phys. Lett. 61(19), p. 2347, November 1992).

SUMMARY OF THE INVENTION

In one form of the invention, a method is disclosed for fabricating a semiconductor-on-insulator structure comprising the steps of: forming an insulator layer; forming a layer comprising boron (B) on the insulator layer; and forming a semiconductor layer on the layer comprising B.

In another form of the invention, a method is disclosed for fabricating a semiconductor-on-insulator structure comprising the steps of: providing a Si substrate; forming a layer comprising $CaF_2$ on the substrate; forming a layer comprising B on the layer comprising $CaF_2$; and forming a semiconductor layer on the layer comprising B.

In still another form of the invention, a semiconductor-on-insulator structure is disclosed, the structure comprising: an insulator layer; a layer comprising B on the insulator layer; and a semiconductor layer on the layer comprising B.

An advantage of the invention is that it allows the formation of a semiconductor-on-insulator structure without the formation of islands and other defects that have plagued prior art techniques. Another advantage of the invention is that semiconductor films may be grown that predominately have a crystalline orientation identical to that of the insulator layer on which the semiconductor is grown. Films having this property have been shown to be superior to unoriented films.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

While $CaF_2$ and other fluorides have been used as buffer layers, either to reduce the lattice mismatch and/or stress between a substrate and a top-layer film, or as an insulator for semiconductor-on-insulator (SOI) devices, epitaxial growth of high quality semiconductors on these fluorides is often difficult because the surface free energy of the fluoride is lower than the surface free energy of the semiconductor film. The higher surface energy of the semiconductor results in three dimensional island growth and thus degrades the crystalline quality of the semiconductor films.

Previous studies of Ge epitaxial growth on $CaF_2$, $SrF_2$, and $(Ca,Sr)F_2$ have shown that the crystalline quality of Ge on $CaF_2$ is better than that of Si on $CaF_2$, even though the lattice mismatch between Ge and $CaF_2$ is bigger than the mismatch between Si and $CaF_2$ at room temperature. Similar to the growth of Si on the fluorides, Ge forms islands and the Ge(111) is typically a mixture of A- and B-type grains on CaF$_2$(111)/Si(111). ("A-type" epitaxy denotes the growth of a film with crystalline orientations identical to the underlying material. "B-type" epitaxy refers to the film with crystalline orientations rotated 180° azimuthally with respect to the underlying material.) The crystalline quality of the Ge is reportedly improved when a thin (about 1 nm) amorphous Ge layer is deposited at room temperature before the subsequent growth of Ge at a higher temperature (see S. Kanemaru, et al. "Improvement of the Quality of Ge Films on CaF$_2$/Si(111) Structures by Predeposited Thin Ge Layers", Surf. Sci. 174 p. 666, 1986).

Although the function of the predeposited amorphous Ge layer is not completely clear, it can be reasoned that the low-temperature-deposited Ge layer suppresses island formation by decreasing the kinetic energy available for the Ge atoms deposited over the amorphous Ge layer. The predeposited Ge layer may also reduce the interfacial reaction between impinging Ge atoms and the CaF$_2$ film.

The problem of three-dimensional growth, or "islanding", is also important for other material systems, particularly for Ge on Si. The method discussed above, using "surfactants" such as Sb, Ga, As and Te to suppress island formation, has been widely studied for the epitaxial growth of Ge on Si. While Ge grows on Si(100) by the Stranski-Krastanov mode (layer-by-layer growth followed by island formation), its three dimensional growth can be suppressed when a thin surfactant layer is evaporated on the Si(100) substrate prior to the Ge deposition. The surfactant exchanges sites with Ge and remains on the top during the Ge growth. Since the surface energy of the surfactant is smaller than the energies of the epilayers and the substrate, it promotes layer-by-layer growth. The surfactants have also been found to increase critical thickness and reduce defects in the Ge film.

Applicant has discovered that significantly improved Ge crystalline quality results when a thin boron (B) layer is deposited on CaF$_2$(111)/Si(111) or CaF$_2$(100)/Si(100) prior to the epitaxial growth of Ge on CaF$_2$/Si, or Si on CaF$_2$/Si. In contrast to the aforementioned surfactants, which migrate to the growth front, the predeposited B stays at the Ge/CaF$_2$ interface. Furthermore, the B predeposit suppresses the migration of Ca to the top surface of the Ge films, and prevents interaction between Ge and CaF$_2$. Applicant has also found that on CaF$_2$(111)/Si(111) substrates, the predeposited B promotes the epitaxial growth of A-type Ge, a result that is important for achieving superior film quality.

Figure 1:
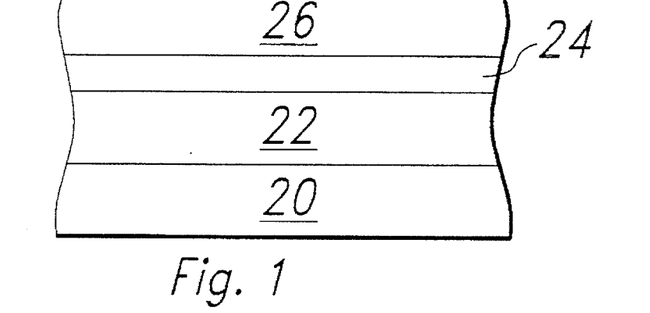
FIG. 1 is a cross-sectional view of a first preferred embodiment material structure.

In a first preferred embodiment of the invention, shown in FIG. 1, CaF$_2$ and Ge films are grown on Si(111) and Si(100) wafers by molecular beam epitaxy (MBE). Clean Si surfaces are obtained by annealing a 4-inch Si wafer 20 (wafers in both the (111) and (100) orientations have been used) in an MBE chamber at approximately 950° C. for about 10 minutes, plus another approximately 10 minutes with Si evaporating at a rate of about 0.01 monolayers per second. Reflection high-energy electron diffraction and Auger electron spectroscopy are used to characterize the cleaning process. The CaF$_2$ 22 and B 24 are deposited from effusion cells with growth rates of approximately 4 nm per minute and approximately 0.005 nm per second, respectively. The Ge 26 is deposited by electron beam evaporation at a rate of approximately 6.6 nm per minute. For Ge/CaF$_2$/Si(111) samples, the CaF$_2$ is grown by ramping the substrate temperature from approximately 100° C. to approximately 600° C. over about five minutes to achieve high quality A-type films. The Ge and B are grown at a constant temperature in the range of approximately 400° C. to approximately 700° C., with a preferred temperature of about 600° C. In a second preferred embodiment in which a Ge/CaF$_2$/Si(100) material structure is formed, the CaF$_2$, Ge, and B layers are all grown at a constant temperature in the range of approximately 400°–700° C., with a preferred temperature of approximately 600° C. The thicknesses of the Ge, CaF$_2$, and B layers are approximately 0.2 um, 0.2 um and 1 nm, respectively. The crystalline properties of Ge are typically studied by x-ray diffraction analysis and cross-section transmission electron microscopy (TEM), while the depth profiles of various elements are characterized by secondary ion mass spectroscopy (SIMS). The surface morphology is studied by Nomarski optical microscopy.

Figure 2:
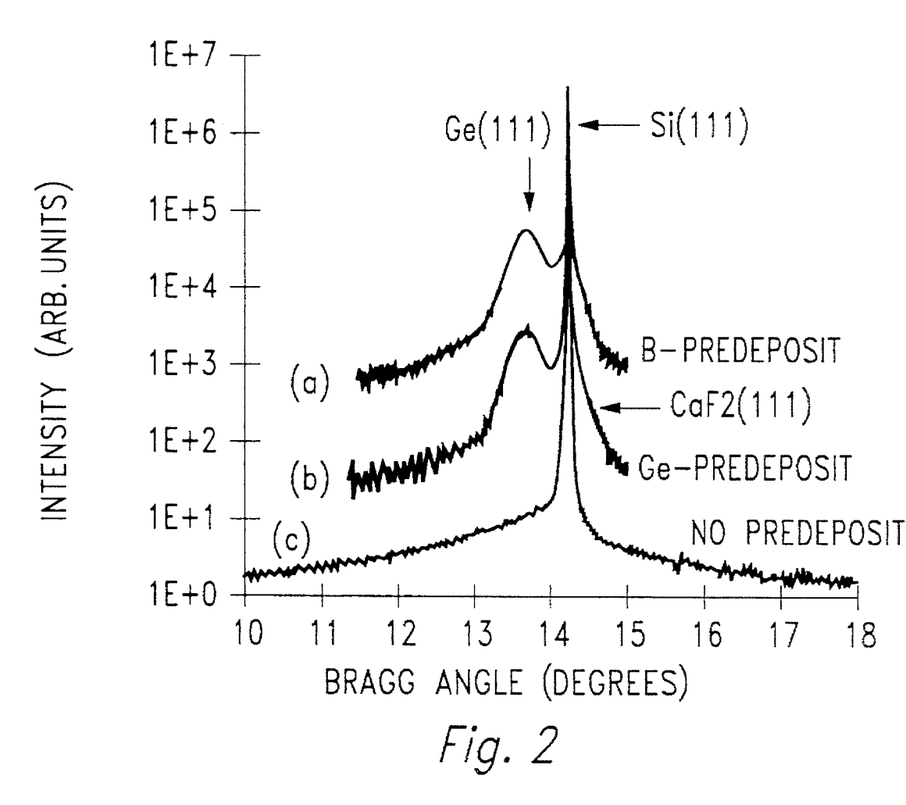
FIG. 2 is a plot of x-ray diffraction data showing the (111) peaks of Ge, $CaF_2$ and Si for three Ge/$CaF_2$/Si(111) samples.
Figure 3A:
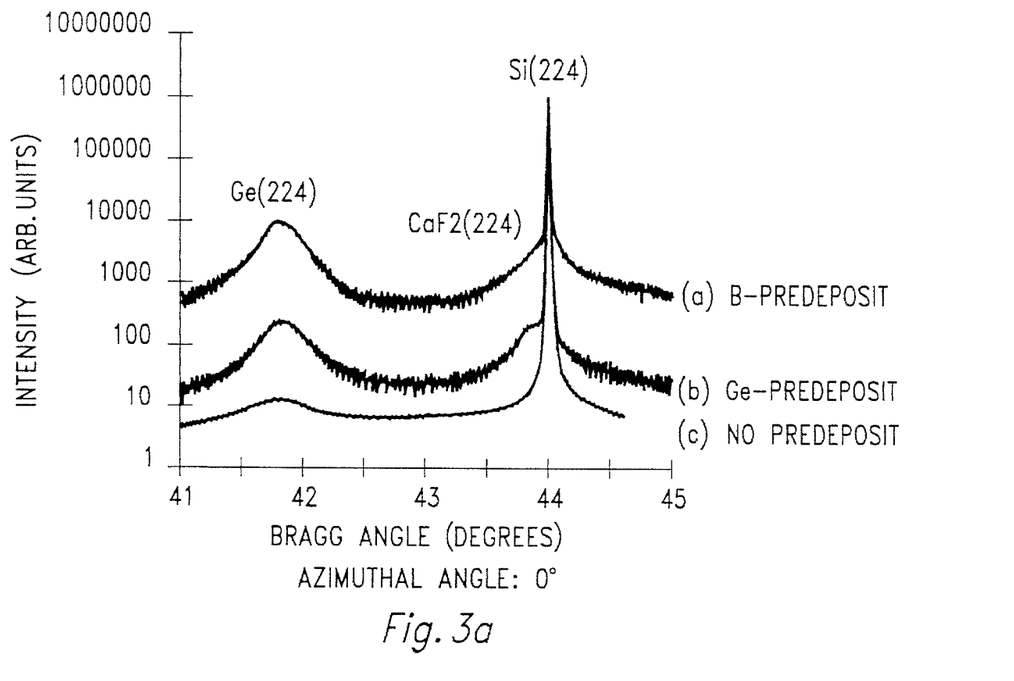
FIGS. 3a and 3b are plots of x-ray diffraction data showing the (224) peaks of Ge, $CaF_2$ and Si for three Ge/$CaF_2$/Si(111) samples at two azimuthal angles.
Figure 3B:
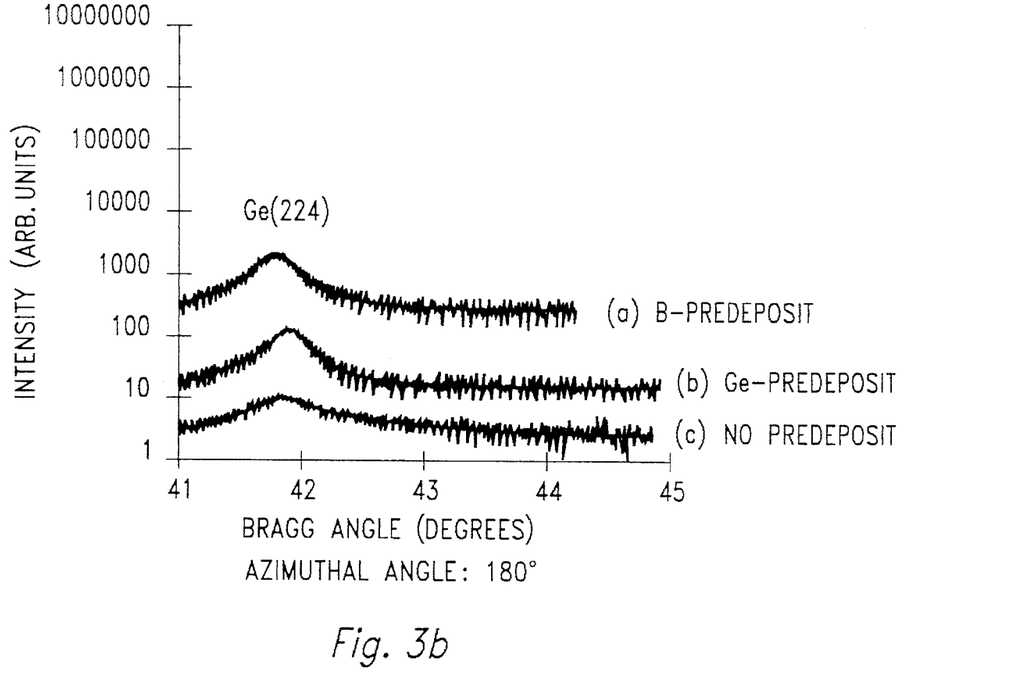

FIG. 2 shows the (111) peaks of Ge, CaF$_2$ and Si for three Ge/CaF$_2$/Si(111) samples grown by using: a) an approximately 1 nm B predeposit, b) an approximately 1 nm Ge predeposit grown at room temperature and c) no predeposited layer. The amplitudes of the Ge peaks are 730,430 and 40 counts per second for a), b), and c), respectively. FIGS. 3a and 3b show the Ge(224) peaks of the three samples for two different azimuthal angles. The peaks are well separated from the CaF$_2$(224) and Si(224) peaks and are easier to characterize than the Ge(111) peak. The amplitudes of the peaks are 2530, 1350, and 1190 counts per second, for a), b) and c), respectively. These results show that the crystalline quality of Ge with a B predeposit is not only better than the crystalline quality of Ge with no predeposit, but also better than that with a thin Ge predeposit. Similar improvement in Ge crystalline quality was observed from Ge/CaF$_2$/Si(100) samples (when a 1 nm B predeposit was used), by analyzing the x-ray rocking curves of the Ge(004) and Ge(224) peaks.

Figure 4:
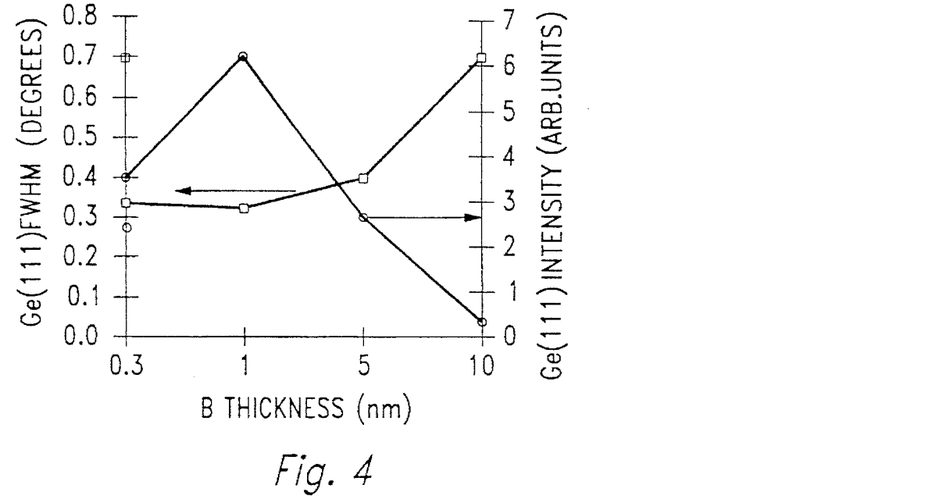
FIG. 4 is a plot showing the full-width-half-maximum (FWHM) and intensity of Ge(111) peaks for Ge/$CaF_2$/Si(111) structures with B predeposited layers of varying thickness.

FIG. 4 shows the FWHM and intensity of Ge(111)peaks for Ge/CaF$_2$/Si(111) structures with B predeposited layers of varying thickness. Smaller Ge FWHM and larger intensity indicate better crystalline quality. It is clear from this Figure that a predeposited B layer of approximately 1 nm in thickness provides superior crystalline quality than do B layers of 0.3, 5, and 10 nm.

Figure 5:
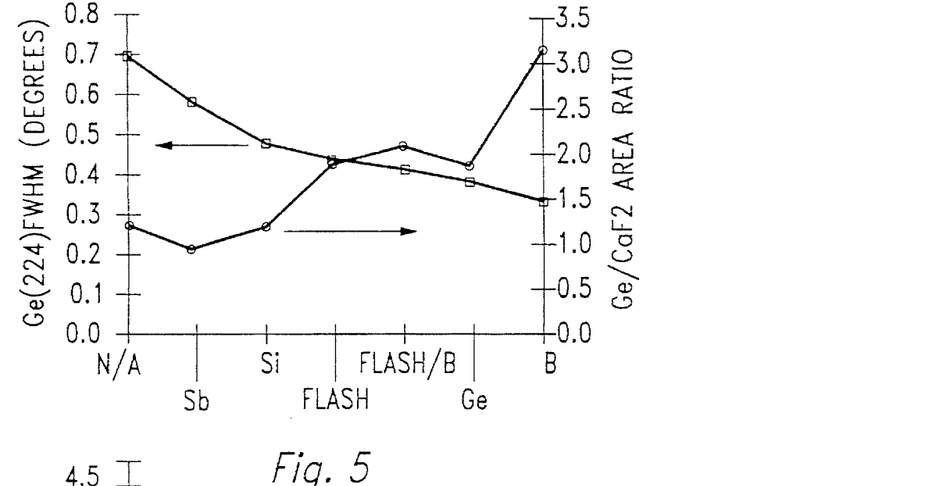
FIG. 5 is a plot showing the FWHM of Ge(224) peaks for Ge/$CaF_2$/Si(111) samples with various surface modification treatments.

FIG. 5 shows the FWHM of Ge(224) peaks for Ge/CaF$_2$/Si(111) samples with various surface modification treatments. "N/A" in FIGS. 5 and 6 indicates that no predeposited layer was used. "Flash" indicates that the CaF$_2$ was heated to approximately 950° C. prior to deposition of the Ge layer. "Flash/B" indicates that the CaF$_2$ was heated to approximately 950° C. prior to deposition of B, followed by the Ge layer. "Sb", "Si", "Ge", and "B" indicate the material used as a predeposit before the deposition of Ge. Smaller Ge FWHM and larger Ge/CaF$_2$ ratio indicate better crystalline quality. The crystalline quality of Ge is clearly improved when 1 nm thick B is predeposited on CaF$_2$ before the following Ge growth (as in the first preferred embodiment). Depositing 1 nm Ge, as reported by Kanemaru et al., also improves the Ge quality, but not to the extent of that achieved by the B predeposit. FIG. 5 also shows that some improvement can be obtained when the CaF$_2$ is heated to 950° C. prior to deposition of the B layer and the following Ge layer growth. Deposition of 1 nm of Sb or Si prior to the Ge layer growth did not show significant improvement in Ge crystalline quality.

The ratios of A-type to B-type Ge on CaF$_2$/Si(111) are approximately 4.1, 2.1 and 1.5 for the B-predeposited, Gepredeposited and Ge/CaF$_2$/Si(111) samples with no predeposited layer, respectively. The ratios of A-type to B-type grains are determined by comparing the Ge(224) peaks at opposite azimuthal directions. X-ray diffraction measurements are carried out at room temperature after the films are prepared. The samples are mounted on a four-circle diffractometer equipped with a channel cut Ge crystal as the monochromator. Cu $K_\alpha$ radiation is used. The FWHM of the symmetric (111) reflection curve is used to estimate the crystal quality of these films. For films of the same thickness, a smaller FWHM indicates better crystalline quality. In order to identify the structure type as A-type and/or B-type, the asymmetric reflection from (224) planes of the Ge and $CaF_2$ films and the Si substrate is measured. The (224) plane makes an angle of approximately 19.5° with respect to the (111) sample surface.

Figure 6:
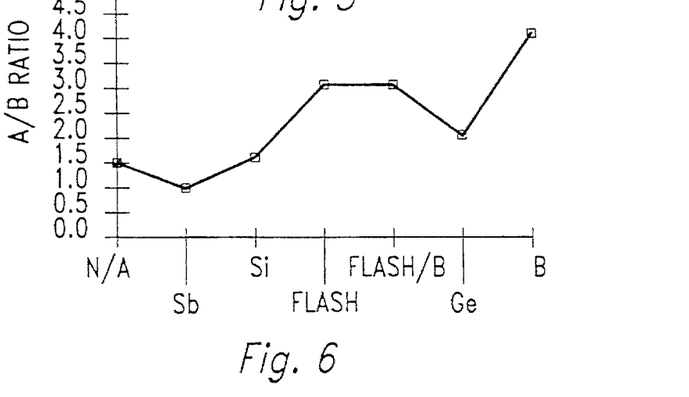
FIG. 6 is a plot showing ratios of A-type and B-type Ge on $CaF_2$/Si(111) modified by various methods prior to Ge growth.

The ratios of A-type to B-type Ge on $CaF_2$/Si(111) modified by various methods prior to Ge growth are shown in FIG. 6 (N/A in FIG. 6 indicates that no predeposited layer was used). Since the boundaries between A-type and B-type grains are twin defects, it is desirable to have films with either A-type or B-type orientation, but not grains of mixed orientation. A film with an A/B ratio close to unity tends to have worse crystalline quality than a film with a higher or lower A/B ratio, because of its high concentration of twin boundaries. In FIG. 6, it is clear that a B predeposit before Ge layer growth has the highest A/B ratio of the various methods. Again, this is consistent with a crystalline quality that is superior to that produced with the other methods. From FIG. 6, it is apparent that some improvement can be obtained when the $CaF_2$ is heated to approximately 950° C. prior to the deposition of subsequent layers.

Figure 7A:
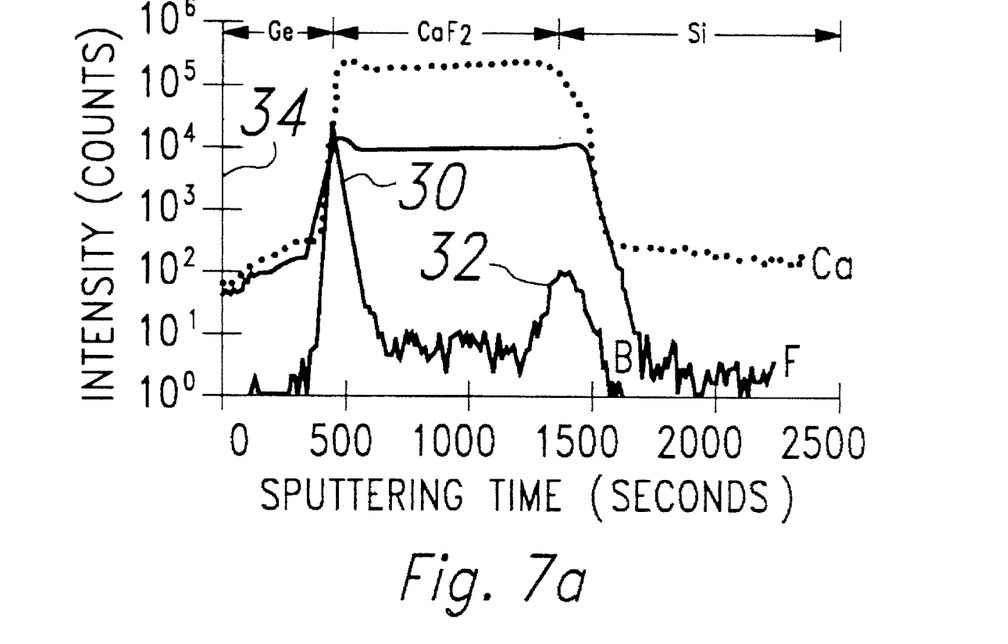
FIGS. 7a and 7b are SIMS depth profiles of Ge/$CaF_2$/Si(111) with (FIG. 7a), and without (FIG. 7b), an approximately 1 nm B predeposit.
Figure 7B:
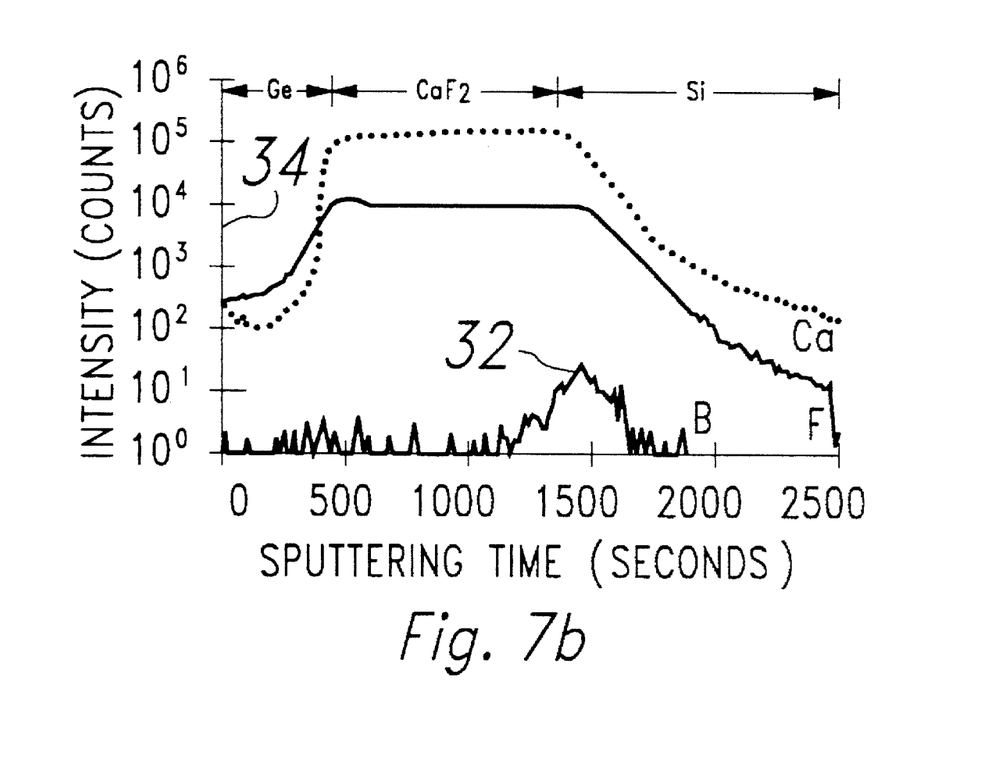

FIGS. 7a and 7b are the SIMS depth profiles of Ge/$CaF_2$/Si(111) with (FIG. 7a), and without (FIG. 7b), an approximately 1 nm B predeposit, respectively. A clear B peak 30 is observed at the Ge/$CaF_2$ interface when a B predeposit was used. The small B peaks 32 at the $CaF_2$/Si interfaces in the two figures are due to autodoping during thermal cleaning of the Si substrates. No B was detected at the Ge surface 34, indicating that B does not migrate to the growth front during Ge deposition. Furthermore, FIG. 7a shows no Ca near the Ge surface (i.e. the Ca concentration is lower at the Ge surface than in the bulk Si). In contrast, the sample with no B predeposit shows a small Ca peak near the Ge surface. This comparison shows that the B (FIG. 7b) predeposit can prevent Ca migration in the Ge films.

Figures 8A, 8B:
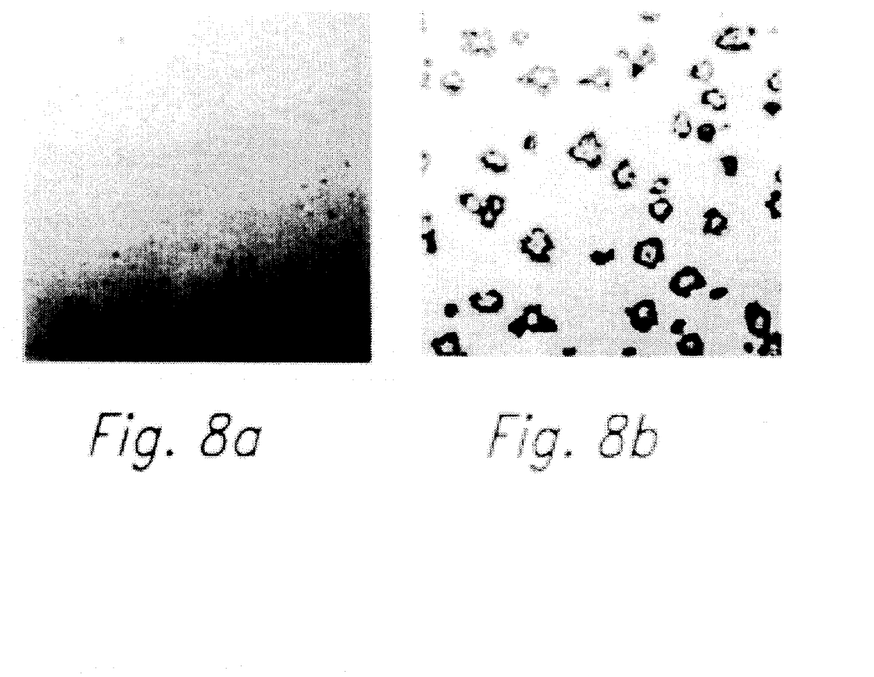
FIGS. 8a–8d show the surface morphology of Ge films during nucleation and final stages of growth.
Figures 8C, 8D:
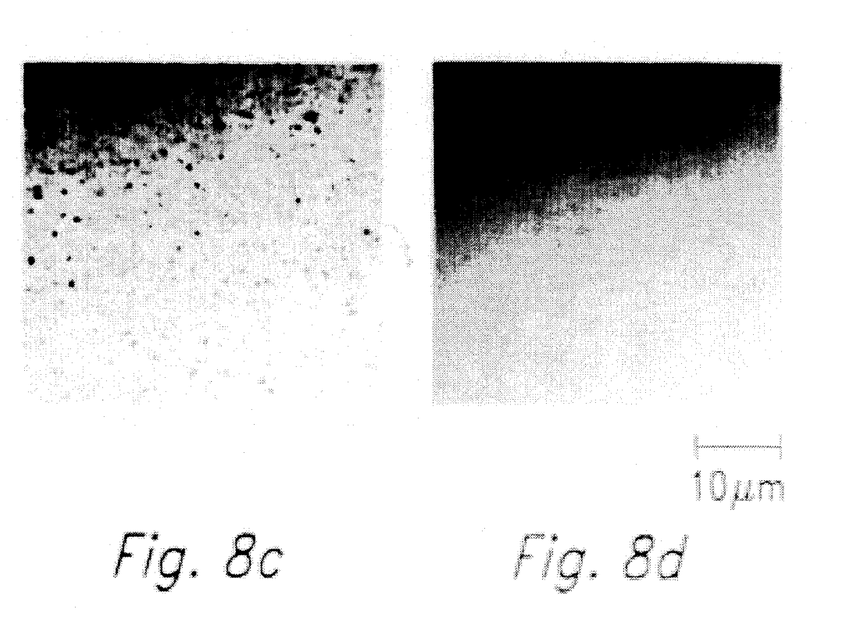

The surface morphology of the Ge films during nucleation and final growth stages are shown in FIGS. 8a to 8d. FIGS. 8a and 8b are optical micrographs of 4 nm thick Ge on B-covered $CaF_2$(111), and $CaF_2$(111) with no predeposited layer, respectively. It is clearly shown that at the nucleation stage, B helps Ge to wet the $CaF_2$ surface, which in turn suppresses island formation (FIG. 8a). Without the B predeposit, large Ge islands may be clearly seen (FIG. 8b). FIGS. 8c and 8d are micrographs of 0.2 um thick Ge on B-covered $CaF_2$(111), and $CaF_2$(111) with no predeposited layer, respectively. The surfaces are smoother than those during the nucleation stage. The surface of the sample with the B predeposit (FIG. 8c) is very shiny and shows little texture under an optical microscope, in contrast to the highly textured surface in FIG. 8d. TEM pictures of cross-sections of the samples show that the Ge/$CaF_2$ interface is sharper and smoother when the B predeposit is used. The major defects in the Ge films are twin boundaries along the $(11\bar{2})$, $(11\bar{1})$ and (111) planes. The surface morphology of Ge/$CaF_2$/Si(100) samples is also improved when a B predeposit is used, but the difference is not as clear as in FIGS. 8c and 8d.

Figure 9A:
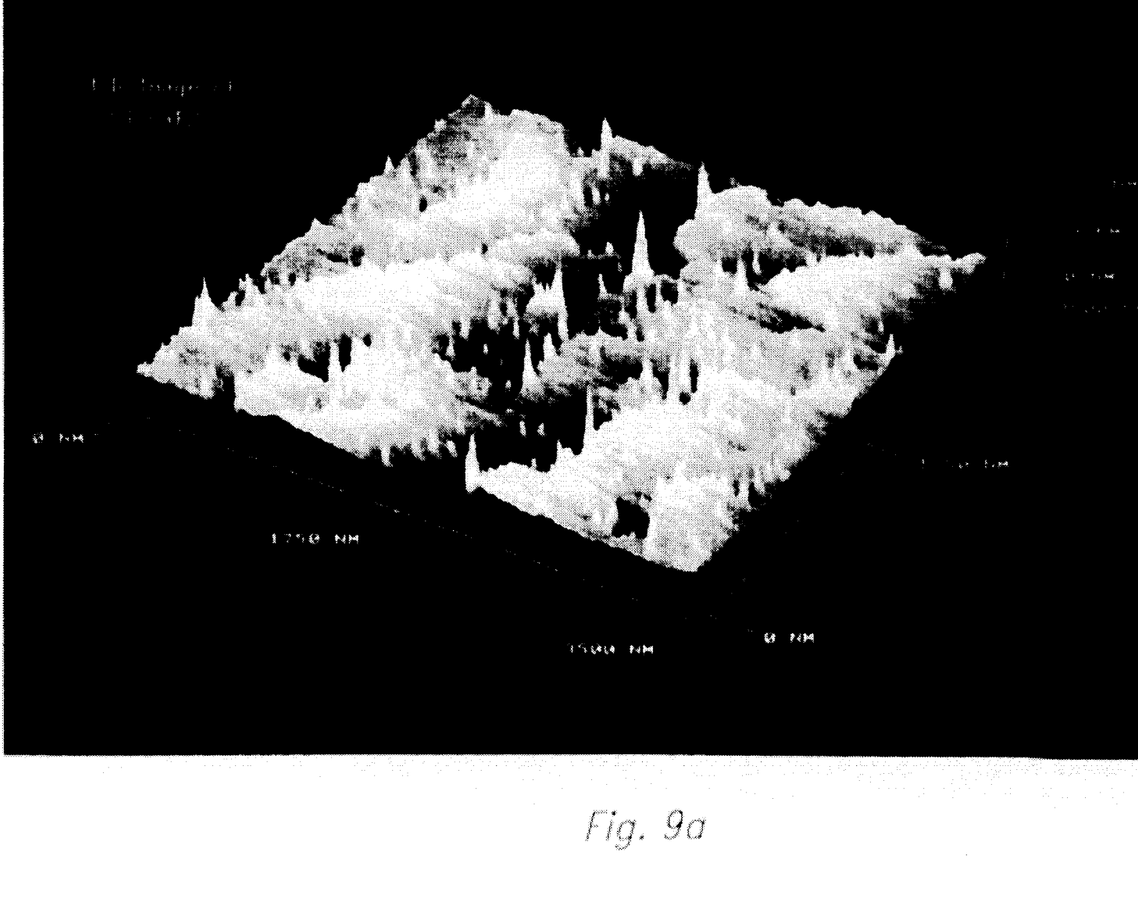
FIGS. 9a and 9b are micrographs of approximately 4 nm thick Si on $CaF_2$/Si(111) with (FIG. 9a), and without (FIG. 9b), an approximately 1 nm B predeposit.
Figure 9B:
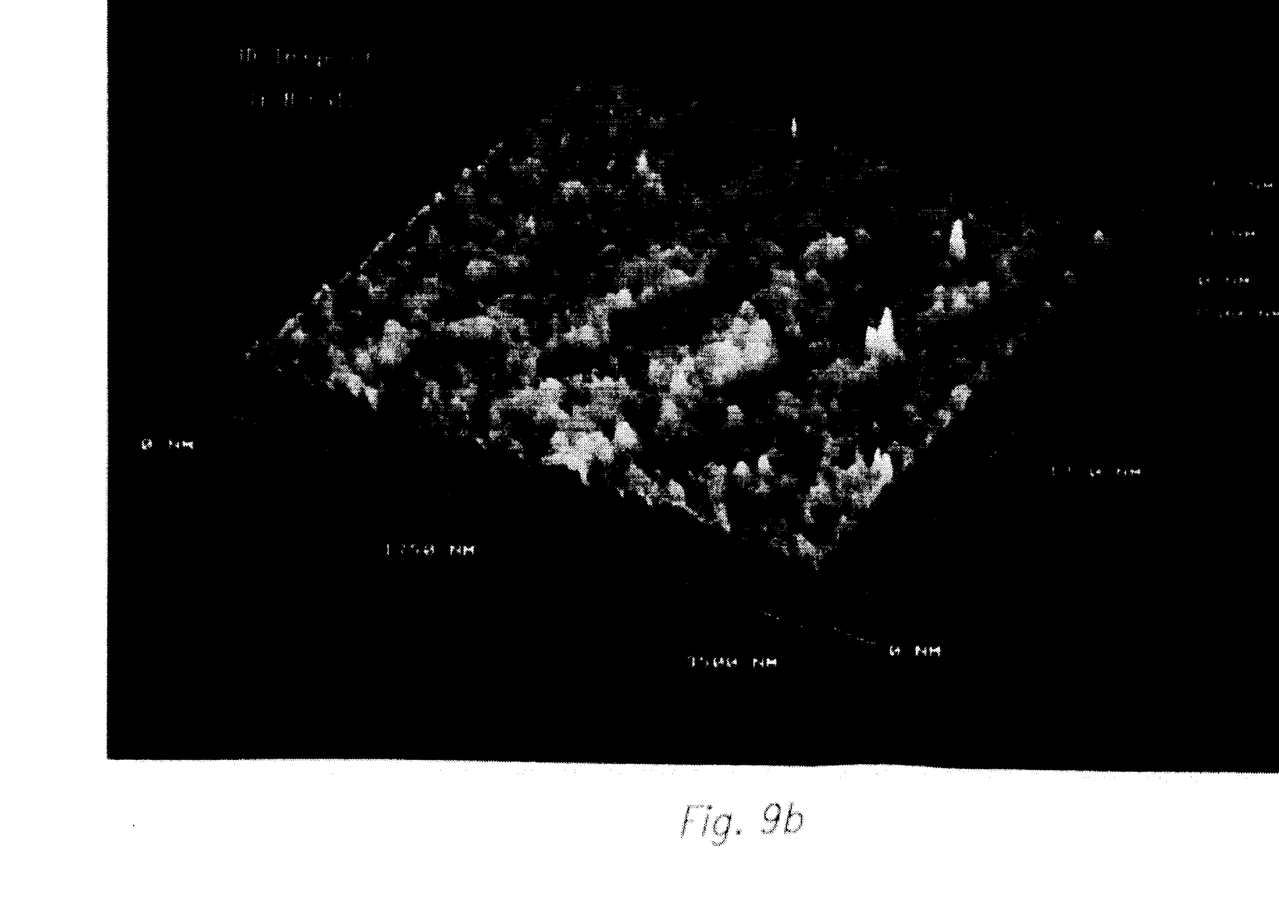

In addition to Ge/$CaF_2$/Si, experiments have also been performed for the Si/$CaF_2$/Si material structure. However, since it is more difficult to characterize the crystalline quality of the Si on $CaF_2$/Si by x-ray diffraction (because of the very large substrate Si peak that results), the effect of the B predeposit in the Si/$CaF_2$/Si material structure was studied by atomic force microscopy. FIGS. 9a and 9b are micrographs of approximately 4 nm thick Si on $CaF_2$/Si(111) without (FIG. 9a), and with (FIG. 9b), an approximately 1 nm B predeposit. It is clearly shown that the B predeposit improves the surface morphology of the film and suppresses island formation. Thus, there is strong evidence that the beneficial effects of a B predeposit described hereinabove for the Ge/$CaF_2$/Si material system, also apply to the Si/$CaF_2$/Si material system.

It is believed that the B predeposit changes the surface energies of the $CaF_2$/Si samples and thus allows the Ge or Si subsequently deposited to wet the new surface more readily. It is likely to form relatively strong bonds with $CaF_2$ so that Ca atoms do not migrate into the Ge or Si films. The B atoms most likely stay at proper sites on the $CaF_2$ so that they do not interfere with the epitaxial growth of Ge or Si.

In summary, by modifying the surface energy of $CaF_2$ with a thin B layer, Applicant has been able to improve the surface morphology and crystalline quality of Ge films on $CaF_2$/Si(111) and $CaF_2$/Si(100). Similar concepts have been applied to the epitaxial growth of other materials systems, such as Si/$CaF_2$/Si, where the substrate surface energy is lower than the epilayer surface energy. The B predeposit also reduces the interactions between Ge and $CaF_2$, and enhances the growth of A-type Ge(111).

A few preferred embodiments have been described in detail hereinabove. It is to be understood that the scope of the invention also comprehends embodiments different from those described, yet within the scope of the claims. Various modifications and combinations of the illustrative embodiments, as well as other embodiments of the invention, will be apparent to persons skilled in the art upon reference to the description. For example, though $CaF_2$ was the insulator used in the embodiments described herein, it may be appreciated that other fluoride insulators (i.e. $CaF_2$, $SrF_2$, $BaF_2$, or mixtures thereof, for example) may also be used in this invention. In addition, though Si and Ge were the semiconductors used in the embodiments of the invention, it may be appreciated that other semiconductors (i.e. GaAs and InP, for example) may be used in the invention. It is therefore intended that the appended claims encompass any such modifications or embodiments.

What is claimed is:

1. A method of fabricating a semiconductor-on-insulator structure comprising the steps of:

forming an insulator layer;

forming a layer comprising boron in a concentration effective to form a surfactant layer on said insulator layer; and forming a semiconductor layer on said layer comprising boron.

2. The method of claim 1 wherein said steps of forming said layers comprises epitaxially depositing said layers.

3. The method of claim 1 wherein said step of forming an insulator layer comprises forming a fluoride insulator layer, and wherein said fluoride is taken from a group consisting of $CaF_2$, $SrF_2$, $BaF_2$, or mixtures thereof.

4. The method of claim 1 wherein said step of forming a layer comprising boron includes forming a layer of boron approximately 1 nm in thickness on said insulator layer.

5. The method of claim 1 wherein said step of forming a layer comprising boron is performed at a temperature in the range of approximately 400° C. to approximately 700° C.

6. The method of claim 5 wherein said step of forming a layer comprising boron is performed at a temperature of approximately 600° C.

7. A method of fabricating a semiconductor-on-insulator structure comprising the steps of:

provide a silicon substrate;

forming a layer comprising $CaF_2$ on said substrate;

forming a layer comprising boron in a concentration effective to form a surfactant layer on said layer comprising $CaF_2$;

forming a semiconductor layer on said layer comprising boron.

8. The method of claim 7 wherein said step of providing a silicon substrate comprises providing a silicon substrate in the (111) orientation.

9. The method of claim 7 wherein said step of providing a silicon substrate comprises providing a silicon substrate in the (100) orientation.

10. The method of claim 7 wherein said step of forming a semiconductor layer comprises forming a germanium layer.

11. The method of claim 7 wherein said step of forming a semiconductor layer comprises forming a silicon layer.

12. The method of claim 7 wherein said step of forming a semiconductor layer comprises forming a semiconductor layer predominately having a crystalline orientation identical to that of said layer comprising $CaF_2$.

13. The method of claim 7 wherein said step of forming a layer comprising boron includes forming a layer of boron approximately 1 nm in thickness on said insulator layer.

* * * * *